(12) United States Patent
Dabral et al.

(10) Patent No.: US 12,237,269 B2
(45) Date of Patent: Feb. 25, 2025

(54) SCALABLE LARGE SYSTEM BASED ON ORGANIC INTERCONNECT

(71) Applicant: Apple Inc., Cupertino, CA (US)

(72) Inventors: Sanjay Dabral, Cupertino, CA (US); Ravindranath T. Kollipara, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 17/655,157

(22) Filed: Mar. 16, 2022

(65) Prior Publication Data

US 2023/0299007 A1    Sep. 21, 2023

(51) Int. Cl.
| | |
|---|---|
| H01L 23/538 | (2006.01) |
| H01L 23/00 | (2006.01) |
| H01L 23/498 | (2006.01) |
| H01L 25/065 | (2023.01) |

(52) U.S. Cl.
CPC .... *H01L 23/5381* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 24/16* (2013.01); *H01L 24/17* (2013.01); *H01L 25/0655* (2013.01); *H01L 23/5389* (2013.01); *H01L 2224/1601* (2013.01); *H01L 2224/16227* (2013.01); *H01L 2224/16237* (2013.01); *H01L 2224/1703* (2013.01); *H01L 2924/1431* (2013.01); *H01L 2924/1432* (2013.01); *H01L 2924/1436* (2013.01); *H01L 2924/30105* (2013.01); *H01L 2924/30205* (2013.01)

(58) Field of Classification Search
None
See application file for complete search history.

(56) References Cited

U.S. PATENT DOCUMENTS

| | | | |
|---|---|---|---|
| 6,538,310 B2 | 3/2003 | Hoshino et al. | |
| 8,058,713 B2 | 11/2011 | Nakayama | |
| 8,120,164 B2 | 2/2012 | Jeong et al. | |
| 10,742,217 B2* | 8/2020 | Dabral | G06F 15/7807 |
| 2023/0299007 A1* | 9/2023 | Dabral | H01L 23/5381 |
| 2023/0420378 A1* | 12/2023 | Paital | H01L 24/17 |
| 2024/0006284 A1* | 1/2024 | Darmawikarta | H01L 23/3142 |
| 2024/0006300 A1* | 1/2024 | Yang | H01L 21/4864 |
| 2024/0063131 A1* | 2/2024 | Lee | H01L 25/0652 |
| 2024/0071943 A1* | 2/2024 | Song | H01L 23/49822 |
| 2024/0105577 A1* | 3/2024 | Jiang | H01L 21/486 |

FOREIGN PATENT DOCUMENTS

WO    2019127337 A1    7/2019

* cited by examiner

*Primary Examiner* — Long Pham
(74) *Attorney, Agent, or Firm* — Aikin & Gallant, LLP

(57) ABSTRACT

Multi-chip modules and methods of fabrication are described. The MCM may include a plurality of dies in which die-to-die routing can be partitioned within multiple metal routing layers for shorter die-to-die routings, while longer die-to-die routing can be routed primarily in a single metal routing layer. The plurality of dies may also be arranged in a spaced apart relationship to accommodate additional wiring area, while preserving direct routing areas for the longer die-to-die routing.

24 Claims, 8 Drawing Sheets

SCALABLE LARGE SYSTEM BASED ON ORGANIC INTERCONNECT

BACKGROUND

Field

Embodiments described herein relate to scaled logic and memory systems.

Background Information

Scalable systems require both logic and memory that can be increased in a practical and cost effective method. Further, they should reasonably allow logic and memory scaling independently, to allow for compute, memory bandwidth, and memory capacity tuning as per system requirements. Dynamic random access memory (DRAM) has long been a commodity product for the computer and electronics industries. With a host of end market applications ranging from desktop computers, mobile electronics devices, data centers and networking platforms there has been a rapid development of competing memory platforms depending upon specific requirements, such as bandwidth, capacity, power, latency, and footprint. However, increasing one parameter is often met with tradeoffs of other parameters. For example, increasing DRAM bandwidth often comes with a penalty in other parameters.

Low power double data rate (LPDDR) standards have long been adopted across a variety of markets, including mobile electronics, to meet the performance and capacity requirements. LPDDR platforms and next generations (LPDDR-x) commonly include an arrangement of memory chips or packages around a logic die such as system on chip (SOC) which may include a central processing unit (CPU) and/or graphics processing unit (GPU).

As systems continue to scale to support higher performance and more memory, such systems may include multiple logic dies, each supporting multiple memory dies or packages. The scaled logic may be side-by-side rather than stacked in many implementations due to power delivery and thermal requirements, as well as other stacking issues. As a result, the multi-chip module (MCM) routing substrate must accommodate wiring for side-by-side logic-to-logic connections in addition to the logic-to-memory connections and any other peripheral components.

SUMMARY

Multi-chip modules and methods of fabrication are described which may facilitate routing substrate wiring count gains, allowing lower data rates, improved signal integrity, reduced energy requirements, and a potential reduction in total area. In an embodiment, the routing substrates include multiple routing layer where adjacent dies can be connected with shorter die-to-die routing spanning a first shorter longitudinal distance in multiple metal routing layers, while further spaced apart dies can be connected with longer die-to-die routing spanning a longer longitudinal distance in a single metal routing layer. In an embodiment, a plurality of dies may also be arranged in a spaced apart relationship to accommodate additional wiring area, while preserving direct routing areas for the longer die-to-die routing. The die-to-die routing may be substantially located within a metal routing layers of a routing substrate, and may also extend through input/output (I/O) dies that have been partitioned from the connected dies and embedded within the routing substrate. In another configuration, the die-to-die routing can extend through a cross-bar die either mounted on, or embedded within, the routing substrate.

DETAILED DESCRIPTION

Figure 1A:
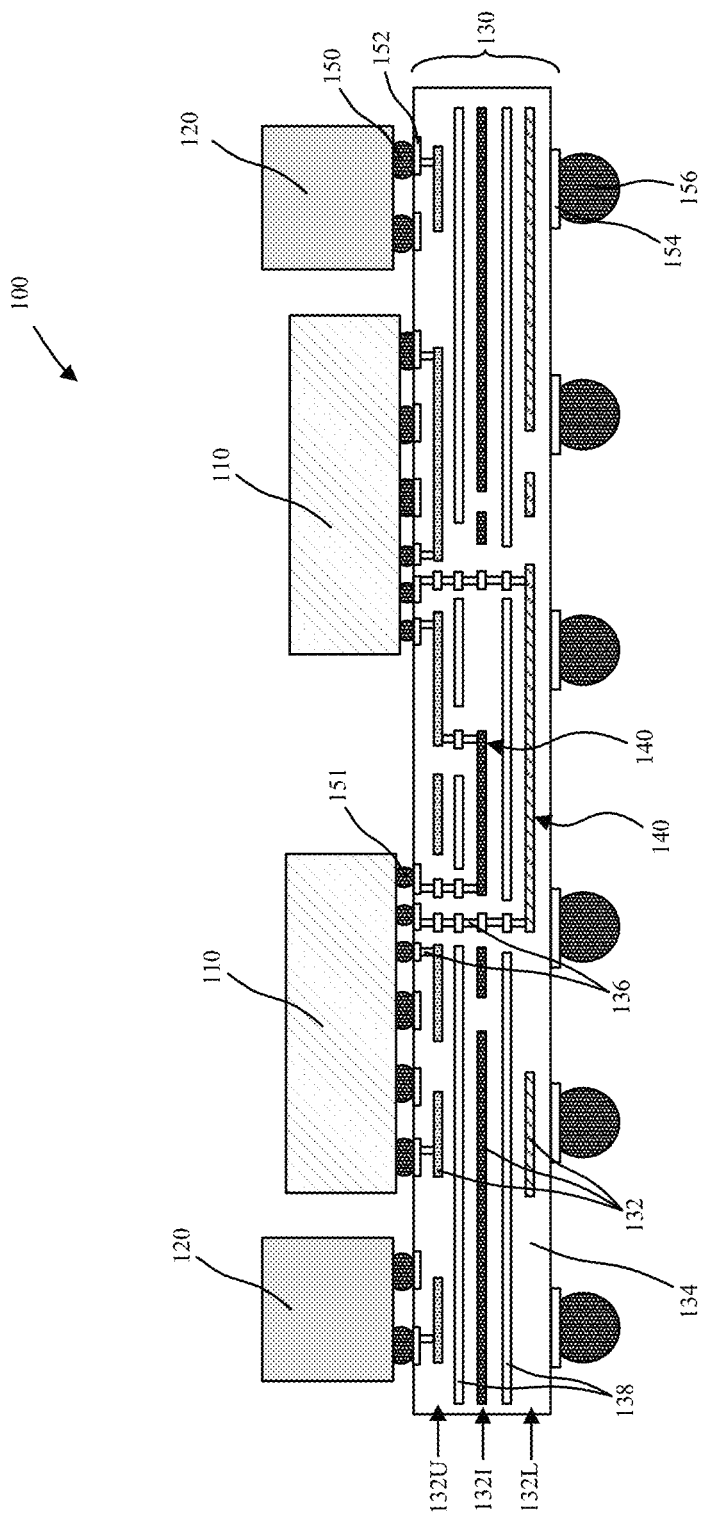
FIG. 1A is a schematic cross-sectional side view illustration of an MCM including a plurality of dies and components mounted on a routing substrate in accordance with an embodiment.

Embodiments describe multi-chip modules (MCMs) including a plurality of dies mounted on a routing substrate in which various dies may be arranged diagonally adjacent or laterally opposite from one another. Die-to-die routings may be provided within the routing substrate or a cross-bar between the various dies, for example to provide short die-to-die routing between the diagonally adjacent dies and longer die-to-die routing between the laterally opposite dies. In some embodiments the plurality of dies may be arranged in a particular spaced apart relationship, for example, where a spacing exists between parallel edges of the diagonally adjacent dies. This spacing in turn can provide additional wiring area, where the shorter die-to-die routings can be substantially located within the additional area, while areas directly between laterally opposite dies can be reserved for longer die-to-die routings. The spaced apart relationship may additionally create additional area/perimeter for placement of additional components, such as for expanding memory capacity of the system. In some embodiments, the shorter die-to-die routings can be substantially located within multiple metal routing layers, for example within the additional wiring area without detracting from available area reserved for the longer die-to-die routings. The various configurations may be used to increase available wiring capability, which can further facilitate overall bandwidth scalability for the MCMs. The module may satisfy many requirements simultaneously, such as inter-processor communication, routing to memory, and input/output (I/O) routing to other modules or components in the system which simultaneously ensuring power deliver and cooling, and mechanical integrity.

In one aspect it, has been observed that for large MCMs, accommodating die-to-die routing between a large number of dies becomes more difficult to support due to limited wiring line space and via pad pitch in the MCM routing substate. This can force lower wiring counts and require higher data rates to achieve a target bandwidth. These higher data rates in turn may require more silicon area for the dies, larger shoreline to accommodate input/output (I/O) regions and physical interface (PHY) regions (e.g. PHY analog and PHY digital controller), more power, and higher speed Serializers/Deserializers (SerDes) among other scalability challenges.

In accordance with embodiments routing arrangements are described in which significant wiring count gains can be obtained, allowing the data rate to be lowered, thereby improving signal integrity, reducing energy requirements, and a potential reduction in total area. In accordance with embodiments, bandwidth requirements may be met by expanding die-to-die placement for logic dies, which would appear counter-intuitive since increased distance can increase signal integrity losses. However, the expanded die-to-die placement in accordance with embodiments can provide for additional signal routing, thus lowering necessary raw bandwidth. Additionally, signal integrity may be preserved by including the main long routing lines (wiring) in a single dedicated metal routing layer, while shorter signal routes between neighboring dies can use two or more metal routing layers. The additional signal routing can be achieved in multiple metal routing layers, which can also allow for finer wiring width (W), spacing (S) and pitch (P), as well as smaller via size. Furthermore, the routing substrates in accordance with embodiments can be formed using thin film deposition, plating and polishing techniques to achieve finer wiring and smoother metal routing layers compared to traditional MCM substrates. In accordance with embodiments additional signal routing requirements can also be met using a die-last MCM packaging sequence. In a die-first packaging sequence the dies can be first molded in a molding compound layer followed by the formation of the routing substrate directly on the molded dies. In one aspect, it has been observed that a die-first packaging sequence can be accompanied by yield limits to the number of metal routing layers that can be formed in the routing substrate. In a die-last packaging sequence a routing substrate can be pre-formed followed by the mounting of the dies onto the pre-formed routing substrate, for example by flip chip bonding. It has been additionally observed that a die-last packaging sequence may allow for the combination of known good dies with a known good routing substrate with a greater number of metal routing layers, facilitating additional wiring gain counts.

The routing arrangements in accordance with embodiments may support high bandwidth with reduced data rates. This may be accomplished by increased wiring gain counts obtained by both expanding chip-to-chip placement and a die-last MCM processing sequence. Additionally, signal integrity can be protected by lower power requirements, and routing architectures in which main long routing lines between logic dies can be primarily located in a single dedicated wiring layer in the routing substrate, while shorter signal routes between neighboring dies can use two or more wiring layers. This may be balanced by achieving overall approximate equal signal integrity.

In some embodiments, I/O dies can be partitioned from the logic dies and packaged within the MCM routing substrate prior to mounting of the logic dies and memory dies or packages. I/O die partitioning can have the effect of reducing logic die area by off-loading I/O regions as well as electrostatic discharge (ESD) circuits from the logic dies. This individual logic die area reduction may furthermore reduce overall MCM area, offsetting the area increase due to expanding chip-to-chip placement.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1A, a schematic cross-sectional side view illustration is provided of an MCM 100 including a plurality of dies 110 and components 120 mounted on a routing substrate 130 in accordance with an embodiment. The routing substrate 130 in accordance with the various embodiments described herein may assume various configurations such as redistribution layers or printed circuit boards (PCBs), each including one or more metal routing layers 132 and insulation (e.g. dielectric) layers 134. Furthermore, the routing substrate 130 may be rigid or flexible. More traditional circuit board type routing substrates 130 may be formed of a variety of materials, including traditional substrates such as FR-2 (a phenolic paper impregnated with resin), FR-4 (a woven fiberglass impregnated with resin), RCC (resin coated copper), ABF (Ajinomoto Build-up Film)

metal or metal core substrates, silicon core substrates, ceramics, polymers, etc. Metal routing layers 132 and vias 136 may be formed of suitable materials, such as copper, gold, aluminum, etc. The routing substrate 130 may be coreless substrates or include cores. The routing substrates 130 in accordance with embodiments can also be formed using thin film techniques. For example, the insulation layer(s) 134 may be formed of a photoimageable dielectric material including polymers (e.g. polyimide, epoxy, epoxy blends, etc.) or inorganic materials (e.g. oxide, nitride), while the metal routing layers 132 and vias 136 may be formed of a suitable metal, including copper. In such an embodiment the metal routing layers 132 result in a smooth surface, lowering conductor losses. Routing substrates formed using thin film techniques may have finer wiring patterns, such as 5 µm W/S, and 25 µm bump pitch (landing pad pitch) compared to more traditional MCM substrates with 10 µm W/S, and 90-110 µm bump pitch (landing pad pitch).

In the illustrated embodiment, the routing substrate 130 includes a plurality of metal routing layers 132, which may include an upper metal routing layer 132U, an intermediate metal routing layer 132I, and a lower metal routing layer 132L. More or fewer metal routing layers 132 may be included. In an embodiment, metal ground/power planes 138 may optionally separate the metal routing layers 132. For example, the metal ground/power planes 138 can be formed of the same materials as the metal routing layers 132.

Dies 110 in accordance with embodiments may be a variety of logic dies, including system on chip (SOC), which may include central processing units (CPU) or graphics processing units (GPU) among others. In addition, the logic die periphery may optionally incorporate a physical interface (PHY) to enable memory integration and other in/out (I/O) to other devices. The additional components 120 can include memory such as dynamic random access memory (DRAM) chips or packages of various types, including low power double data rate platforms and next generations (LPDDR-x), various 3D solutions such as high bandwidth memory (HBM) and hybrid memory cube (HMC), as well as other types of memory. Components 120 may also include other or additional peripheral devices, such as radio frequency (RF) chips, antennas, baseband processors, power management integrated circuits (PMICs), sensors, passives, etc.

Various die-to-die routings 140 may be included within the routing substrate 130 to provide connections between the plurality of dies 110. For example, the die-to-die routings 140 may span along longitudinal lengths of wirings within the metal routing layers 132. The die-to-die routings 140, and in particular the longitudinal lengths, may be substantially located within a single metal routing layer or multiple metal routing layers 132. As used herein the term "substantially located" may refer to a majority to essentially all of the longitudinal length. Thus a "substantial" portion amounts to a significant, and majority contribution, and may correspond to more than a majority contribution including essential amounts.

In accordance with some embodiments, the dies 110 and components 120 may be surface mounted onto the routing substrate 130 in a die-last approach. In such an embodiment, the surface mounting may be a flip chip connection, for example, with solder bumps 150 and optional micro-bumps 151 onto landing pads 152 of the routing substrate 130. Micro-bumps 151 may be smaller than solder bumps 150, and may be used in particular for the die-to-die routing 140 for finer pad pitch and wiring. In the illustrated embodiment micro-bumps 151 may be substantially smaller (less volume) than solder bumps 150 (e.g. for regular flip chip). Alternatively, solder bumps 150 can be used instead of micro-bumps 151. In such an embodiment, the solder bumps 150 may have finer pitch (e.g. 90 µm) in I/O area compared to (e.g. 110 µm) in a main core logic area. In accordance with some embodiments, a respective I/O area of one or more of the dies 110 may have a dedicated portion of the die with specialized die-to-die circuitry designed to manage, enhance and/or enable receiving and transmitting information among the plurality of dies 110. In some embodiments that portion may also include the I/O ports, pins, pads or bumps, such as solder bumps 150 or micro-bumps 151. The routing substrate 130 may additionally include optional contact pads 154 on an opposite side to support optional module solder bumps 156. The dies 110 and components 120 can also be embedded in a molding compound layer. In another embodiment, the routing substrate 130 is formed in a die-first approach, where the routing substrate 130 is formed after encapsulating the dies and components 120 in the molding compound layer.

Figure 1B:
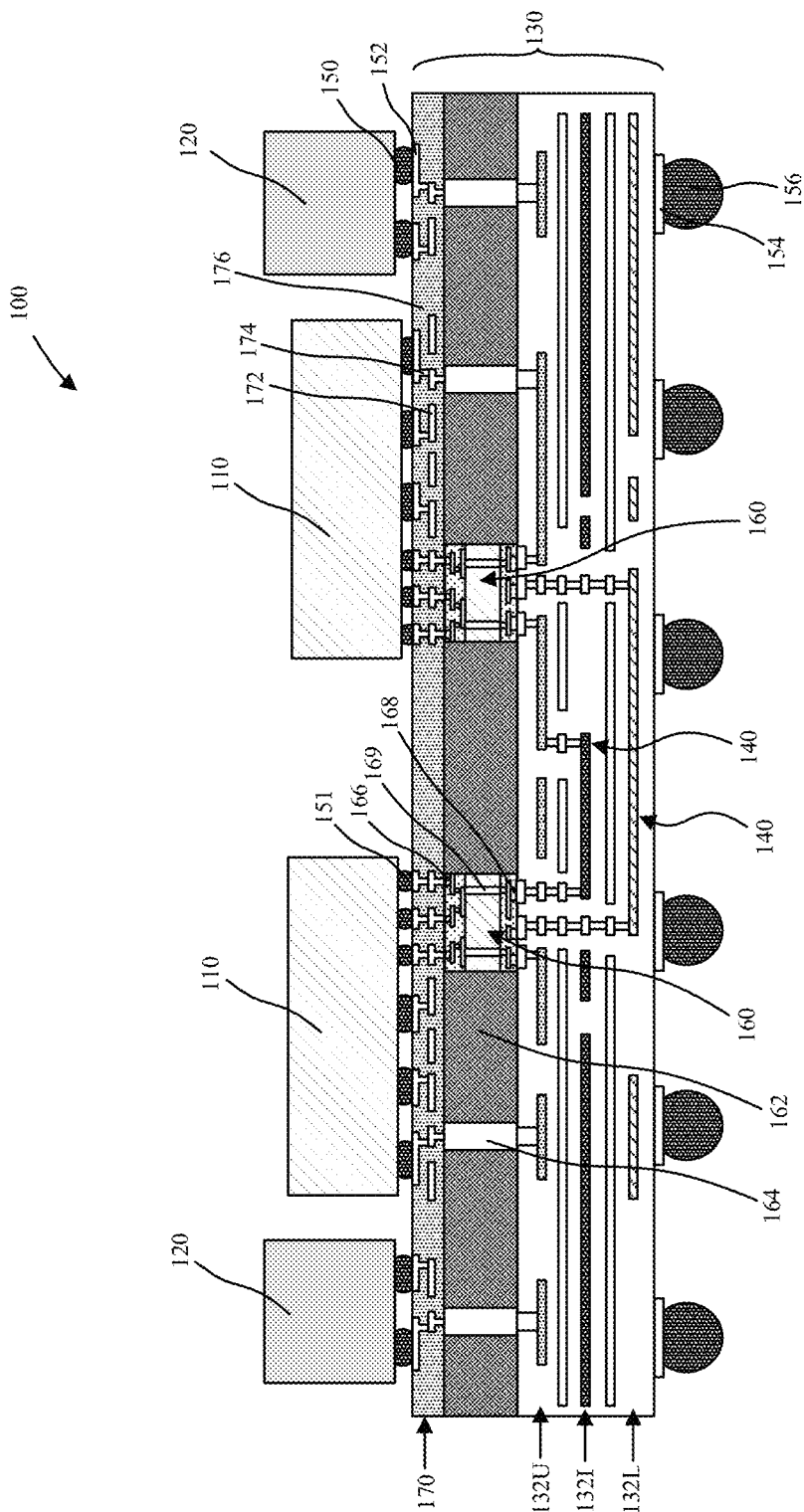
FIG. 1B is a schematic cross-sectional side view illustration of an MCM including a plurality of dies and components mounted on a routing substrate including a plurality of embedded I/O dies in accordance with an embodiment.

FIG. 1B is a schematic cross-sectional side view illustration of an MCM 100 including a plurality of dies and components mounted on a routing substrate including a plurality of embedded I/O dies 160 in accordance with an embodiment. The embodiment illustrated in FIG. 1B is similar to that illustrated in FIG. 1A with the modification that I/O areas from dies 110 can be offloaded to I/O dies 160 that can be embedded within the routing substrate 130. In accordance with embodiments, the I/O regions and/or PHY regions, SerDes, etc. can be offloaded from the dies 110 to the I/O dies 160. I/O die partitioning can have the effect of reducing logic die area by off-loading I/O regions as well as electrostatic discharge (ESD) circuits for the I/O, thereby reducing capacitance and improving the signal integrity. This individual logic die area reduction may furthermore reduce overall MCM area. Furthermore, the I/O die process may be optimized for the I/O function. As shown in FIG. 1B, the capacitance loading of the micro-bumps 151, associated landing pad 152, 166, 168, and TSV 169 is a short digital path. The longer die-to-die routing 140 paths in the metal routing layers 132 and vias 136 are in a cleaner environment with lower pad capacitance, smaller ESD capacitance, and smaller via discontinuity.

As shown in FIG. 1B, an optional redistribution layer (RDL) 170 including metal routing layer(s) 172, vias 174, dielectric layer 176 and landing pads 152 can be formed over the I/O dies 160 and directly on landing pads 166 of the I/O dies 160. The landing pads 152 may accommodate the solder bumps 150 and micro-bumps 151 for the plurality of dies 110 and components 120. The I/O dies 160 may be embedded within a molding compound layer 162. A plurality of vertical interconnects 164, such as through mold vias (TMVs) or pillars may extend through the molding compound layer 162 to electrically connect the plurality of metal routing layers to the RDL 170, which can also be formed directly on landing pads 168 of the I/O dies 160. TSVs 169 can extend through the I/O dies 160 to connect the RDL 170 to the multiple routing layers 132. In an exemplary process flow the plurality of I/O dies 160 may be mounted on a carrier substrate, followed by encapsulation in the molding compound layer 162. The plurality of vertical interconnects 164 can be formed prior to or after encapsulation with the molding compound layer 162. This may be followed by formation of the RDL 170 using thin film techniques, followed by the plurality of routing layers 132 and dielectric layers 134 using thin film techniques, or vice versa. In accordance with some embodiments, the plurality of dies 110 and components 120 may be mounted after formation of the routing substrate 130.

Figure 1C:
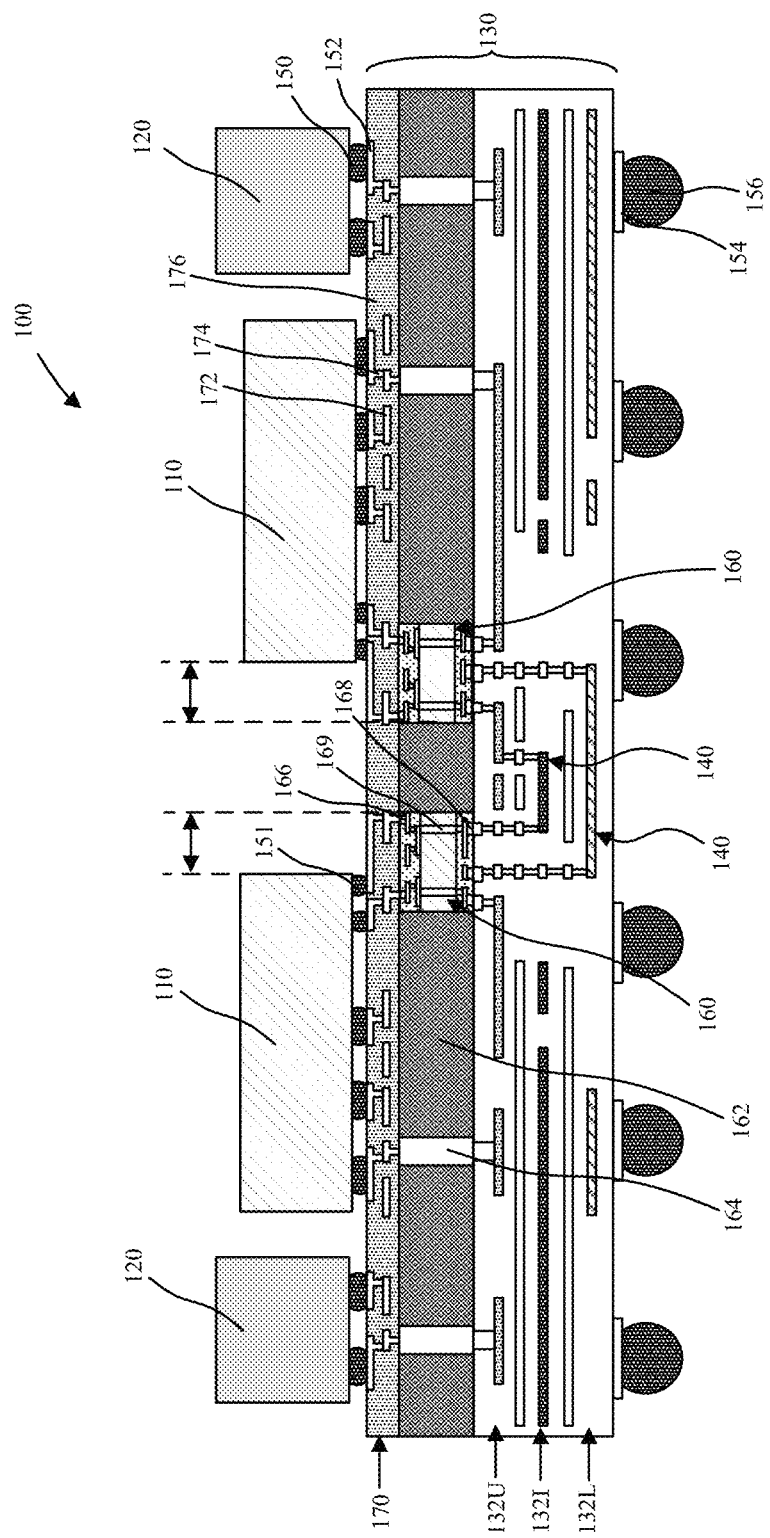
FIG. 1C is a schematic cross-sectional side view illustration of an MCM including a plurality of dies and components mounted on a routing substrate including a plurality of embedded I/O dies at least partially outside of the shadow of the plurality of dies in accordance with an embodiment.
Figure 1D:
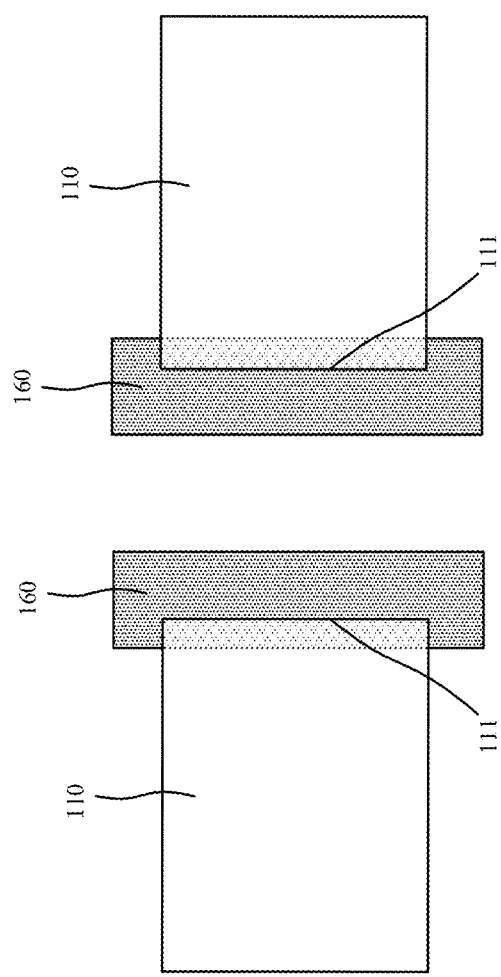
FIG. 1D is a schematic top view illustration of an I/O die with larger width than a corresponding die from which the I/O die is partitioned in accordance with an embodiment.

In the particular embodiment illustrated in FIG. 1B, the I/O dies 160 are shown as being aligned underneath the shadows, and coplanar with edges of the dies 110. However, such an arrangement is not required, and indeed with presence of RDL 170 location of I/O dies 160 and be pinched in or moved closer together for dies to be connected with die-to-die routing 140. Such a configuration is provided in FIG. 1C, where the embedded I/O dies 160 are at least partially outside a shadow of their corresponding dies 110. Such non-overshadowed versions can help with the I/O and core logic power distribution network also. Alternatively, the I/O dies 160 can be shifted internally inside the area of their corresponding dies 110. Since the (core) die 110 may be decoupled from the I/O die 160 width, one may have for example, die 110 having a width of 16 mm, whereas the I/O die 160 may be 22 mm, which can be a significant expansion of the shoreline available to route. FIG. 1D is a schematic top view illustration of an I/O die 160 with larger width than a corresponding die 110 edge 111 from which the I/O die 160 is partitioned in accordance with an embodiment. For example, an edge of the I/O die 160 that is parallel to the die 110 edge 111 may be wider than the die 110 edge 111.

In accordance with embodiments, raw bandwidth requirements can be reduced by an expanded die-to-die spacing, as well and allocation of specific metal routing layers, or areas thereof, to particular die-to-die routings. For example, longer more "lossy" die-to-die routings can be substantially located within dedicated metal routing layers, while shorter die-to-die routings can run through multiple metal routing layers and may also be located in areas created by the added die-to-die spacing. Additionally, segregation of specific I/O dies may be configured, such as with SerDes devices to support long-range interconnects, further increasing signal integrity. Furthermore, the driver impedance can be tuned to match the die-to-die routing 140 impedance. Thus, embodiments may include a variety of combinations of configurations that may improve signal quality, including various possible combinations of larger shoreline, fine landing pad pitch, fine routing lines (wiring) and spacing, lower landing pad capacitance, lower discontinuity, matched driver termination with interconnect, smoother routing lines, and improved dielectric layers between the routing lines.

Figure 2:
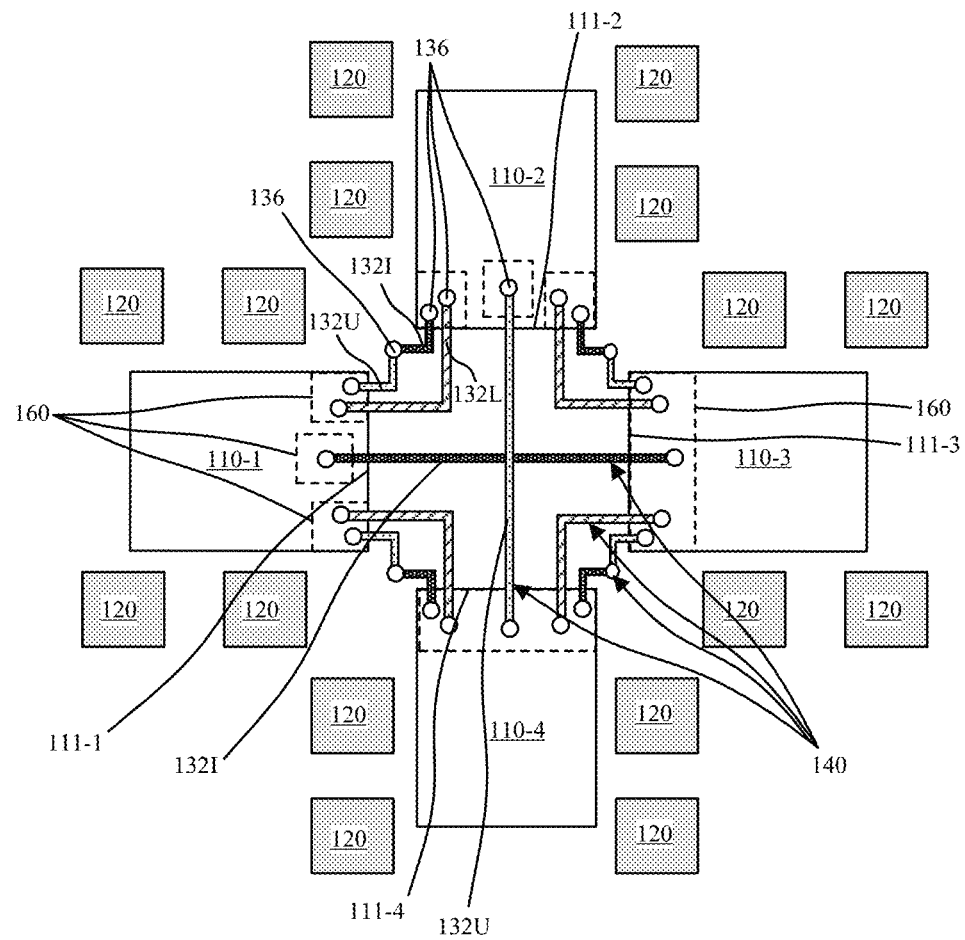
FIG. 2 is a schematic top-down view illustration of an MCM including various die-to-die routings between the plurality of dies in accordance with an embodiment.

Referring now to FIG. 2 a schematic top-down view illustration is provide of an MCM including various die-to-die routings 140 between the plurality of dies in accordance with an embodiment. The particular embodiment illustrated in FIG. 2 includes four dies 110, including a first die 110-1, second die 110-2, third die 110-3, and fourth die 110-4. It is to be appreciated that the four die arrangement is exemplary, and embodiments can be applicable to larger and smaller die sets. Additionally, the arrangement of components 120 adjacent the die edges is exemplary, and alternative arrangements are envisioned. The schematic top view illustration of FIG. 2 also shows exemplary location of optional I/O dies 160. For example, a single or multiple I/O dies 160 can be associated with corresponding dies 110. These areas can alternatively be integrated into dies 110 (e.g., as defined above as I/O areas of dies 110).

In the exemplary embodiment, the first die 110-1 and third die 110-3 are laterally opposite to one another, with a first die edge 111-1 of the first die 110-1 facing a third die edge 111-3 of the third die 110-3. The second die 110-2 and fourth die 110-4 are also laterally opposite to one another, with a second die edge 111-2 of the second die 110-2 facing a fourth die edge 111-4 of the fourth die 110-4. The second die 110-2 is illustrated as being diagonally adjacent to the first die 110-1 and the third die 110-3, and vice versa. The fourth die 110-4 is illustrated as being diagonally adjacent to the first die 110-1 and the third die 110-3, and vice versa. As shown, the second die edge 111-2 of the second die 110-2 is orthogonal to the first die edge 111-1 and the third die edge 111-3. Similarly, the fourth die edge 111-4 of the fourth die 110-4 is orthogonal to the first die edge 111-1 and the third die edge 111-3.

In an embodiment a first die-to-die routing 140 connects the first die 110-1 to the second die 110-2, and spans a longitudinal distance in multiple metal routing layers 132 connected with vias 136. As used herein, longitudinal distance refers to wiring length of the particular signal wires, or interconnect lines, within the metal routings layers. In the exemplary embodiment illustrated, the first die-to-die routing 140 spans a longitudinal length in both the upper meal wiring layer 132U and the intermediate wiring layer 132I, though other combinations are possible. Also illustrated, a second die-to-die routing can connect the first die 110-1 and the third die 110-3, where the second die-to-die routing spans a second longitudinal distance within a single metal routing layer that is greater than the first longitudinal distance. As shown, the second die-to-die routing can span substantially within the intermediate metal wiring layer 132I, though it is possible to be substantially within the other metal wiring layers. For example, the second die 110-2 and fourth die 110-4 are illustrated as being connected with a die-to-die routing 140 spanning a longitudinal distance substantially within the upper metal wiring layer 132U. In accordance with embodiments, the diagonally adjacent dies can also be connected with die-to-die routing 140 spanning a longitudinal length substantially within a single metal routing layer, such as the illustrated lower metal wiring layer 132L.

Figure 3:
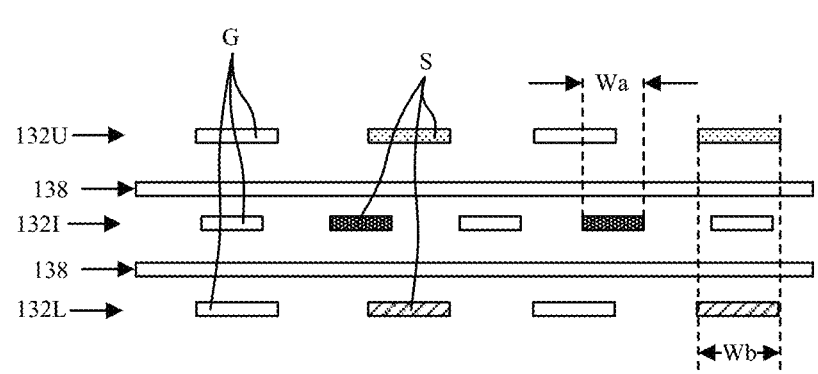
FIG. 3 is a schematic cross-sectional side view illustration of a plurality of wirings within a routing substrate including a plurality of metal routing layers in accordance with an embodiment.

FIG. 3 is a schematic cross-sectional side view illustration of a plurality of wirings within a routing substrate including a plurality of metal routing layers in accordance with an embodiment. Consistent with other illustrated examples, the metal routing layers can include an upper metal routing layer 132U, intermediate metal routing layer 132I, and lower metal routing layer 132L. This is exemplary and additional metal routing layers can be included. Each of the metal routings layers can optionally be separated by a metal ground/power plane 138, which can be formed of the same materials as the metal routing layers. Each metal routing layer may further have different metal traces, such as ground/power traces (G) and signal traces (S). The signal traces (S) can support the die-to-die routings 140, while ground/power traces (G) and metal ground/power planes can be arranged for shielding purposes, etc. while also providing ground/power delivery. In the particular embodiment illustrated the intermediate metal routing layer(s) 132I can include signal traces and ground/power traces with a narrower width (Wa) compared to a width (Wb) of those traces in the outside metal routing layers. This may be allowed due to the ability to arrange additional shielding areas. Furthermore, the narrow width (Wa) and corresponding shorter pitch between traces in the intermediate metal routing layer 132I can allow for an increased wiring density within the layer, allowing for a larger number of die-to-die routings 140. It is to be appreciated that the metal routing arrangement of FIG. 3 may correspond to the die-to-die routings between dies 110, though alternative routing properties can be designed for routing with dies 110 and components 120.

Figure 4A:
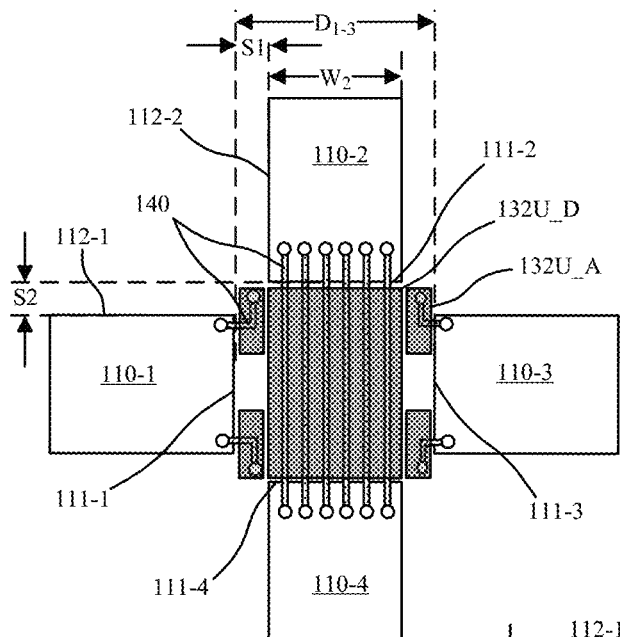
FIG. 4A is a schematic top-down view illustration of various die-to-die routing within an upper metal routing layer in accordance with an embodiment.
Figure 4B:
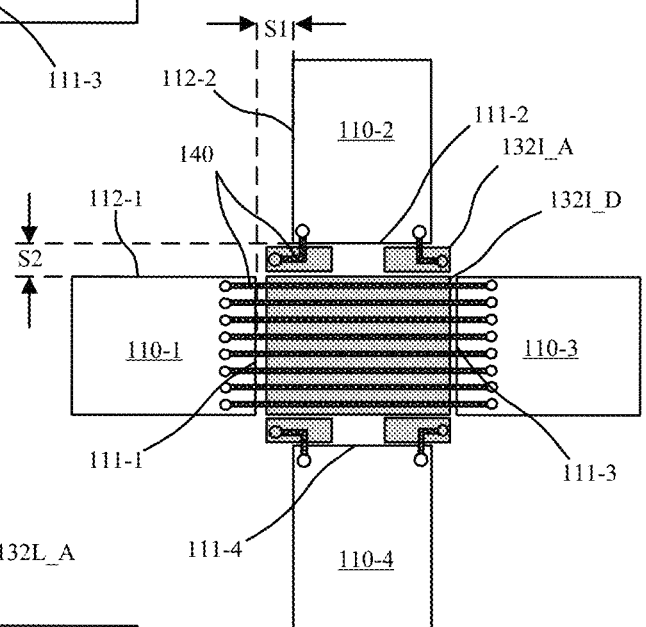
FIG. 4B is a schematic top-down view illustration of various die-to-die routing within an intermediate metal routing layer in accordance with an embodiment.
Figure 4C:
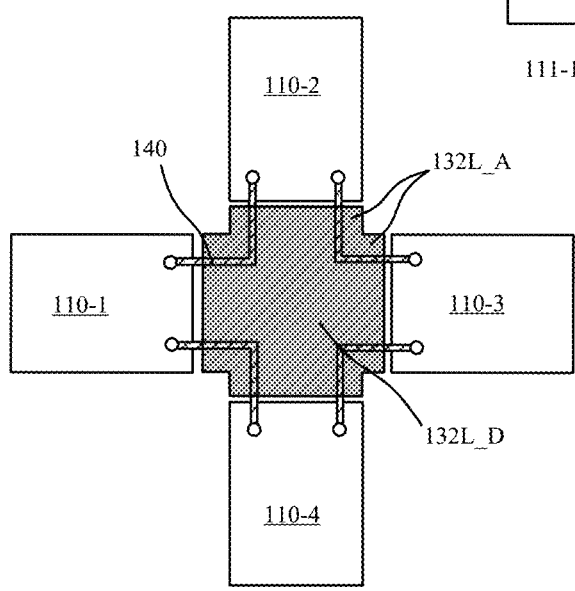
FIG. 4C is a schematic top-down view illustration of various die-to-die routing within a lower metal routing layer in accordance with an embodiment.

Referring now to FIGS. 4A-4C schematic top-down view illustrations are provided of various die-to-die routings within different metal routing layers in accordance with embodiments. Furthermore, an expanded die-to-die spaced arrangement is illustrated to show additional wiring areas created to accommodate an increased wiring density in accordance with embodiments. FIG. 4A is a schematic top-down view illustration of various die-to-die routing 140 within an upper metal routing layer 132U in accordance with an embodiment. FIG. 4B is a schematic top-down view illustration of various die-to-die routing 140 within an intermediate metal routing layer 132I in accordance with an embodiment. FIG. 4C is a schematic top-down view illustration of various die-to-die routing 140 within a lower metal routing layer 132L in accordance with an embodiment. Specifically, the full and partial longitudinal lengths of the die-to-die routings 140 illustrated in FIGS. 4A-4C may correspond to those illustrated in FIG. 2, though each within a single metal routing layer 132. In particular, the die-to-die routings 140 may correspond to metal traces such as signal (S) traces of FIG. 3, though can also correspond to ground/power traces (G).

In the illustrated spaced apart relationship, the first die edge 111-1 is separate from the third die edge 111-3 by a distance ($D_{1-3}$) that is greater than a width ($W_2$) of the second die edge 111-2. The first die edge 111-1 may be spaced apart from a second parallel edge 112-2 of the second die 110-2 by a first spacing (S1). The second die edge 111-2 may be spaced apart from a first parallel edge 112-1 of the first die 110-1 by a second spacing (S2), which may be the same or different than the first spacing (S1). Referring specifically to FIGS. 4A-4B, in an embodiment, the multi-level die-to-die routing 140 between diagonal first die 110-1 and second die 110-2 is substantially located in an area defined by the first spacing (S1) and the second spacing (S2), or more specifically added area 132U_A in the upper metal routing layer 132U created by the first spacing (S1) and area 132I_A in the intermediate metal routing layer 132I created by the second spacing (S2). It is to be appreciated however that some amount of the die-to-die routings 140 may optionally be located directly underneath the shadows of the dies 110.

The additional area created by the die spacings may preserve the most direct routing distances between the laterally opposite dies that may be spaced further apart. For example, die-to-die routing 140 can be substantially located within direct routing area 132U_D in the upper metal routing layer 132U between the second die 110-2 second die edge 111-2 and the fourth die 110-4 fourth die edge 111-4 as shown in FIG. 4A, and die-to-die routing 140 can be substantially located within direct routing area 132I-D in the intermediate metal routing layer 132I between the first die 110-1 first die edge 111-1 and the third die 110-3 third die edge 111-3.

Referring now to FIG. 4C an exemplary illustration is provided of the lower metal routing layer 132L, including added areas 132L_A and direct routing area 132L_D. In the exemplary embodiment illustrated, the die-to-die routing 140 is shown as being substantially located within the lower metal routing layer 132L between diagonally adjacent dies. The die-to-die routing 140 can be located within the direct routing layer 132L_D, added areas 132L_A, or both. The die-to-die routing 140 can also connect laterally opposite dies, or form a portion of a multi-level die-to-to routing. While the die-to-die routing 140 of FIG. 4C is illustrated as being substantially located within the lower metal routing layer 132L, the die-to-die routing 140 may be located within any of the metal routing layers, and can optionally be located adjacent die-to-die routing 140 connecting other dies.

In view of the above, it is apparent a variety of die-to-die routing 140 configurations are possible while embodying the principles of the spaced apart relationship and/or reserving direct routing areas for longer die-to-die connections. Furthermore, while the long-range die-to-die routings 140 are illustrated and described as being between laterally opposite die edges, the principles described herein can also be applied to other long-range routings that are not necessarily between laterally opposite die edges.

Figure 5A:
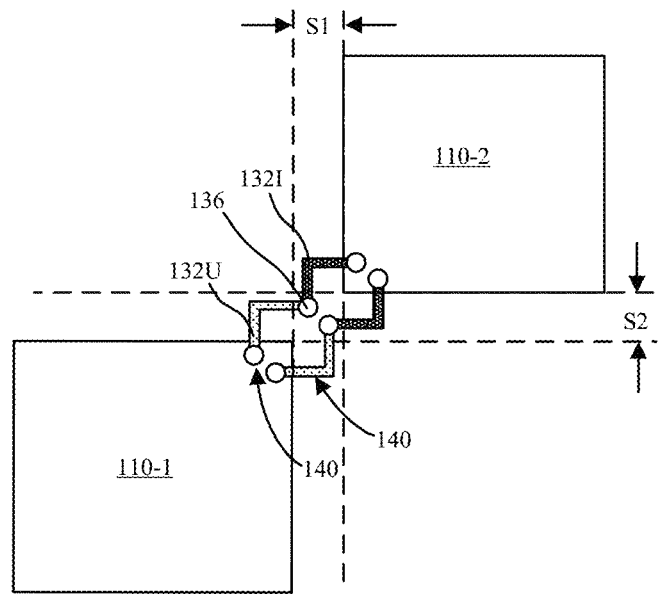
FIGS. 5A-5B are schematic top-down view illustrations of a pair of multi-level die-to die routings in multiple metal routing layers in accordance with embodiments.
Figure 5B:
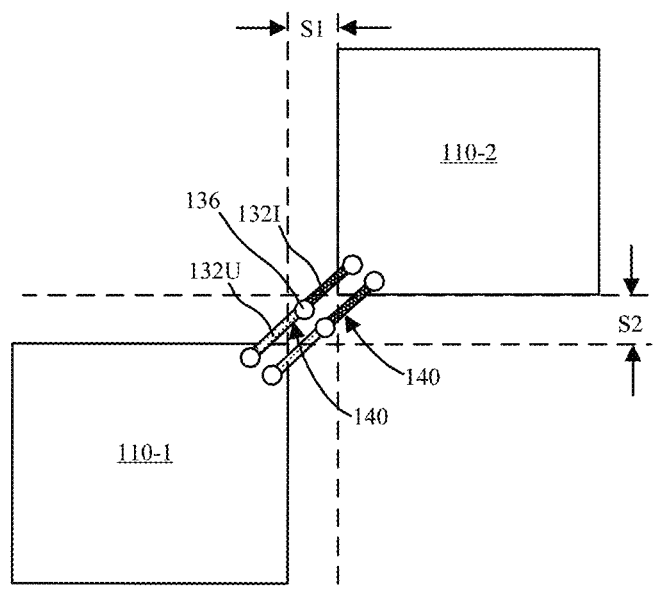

Referring now to FIGS. 5A-5B schematic top-down view illustrations are provided for a pair of multi-level die-to die routings 140 in multiple metal routing layers in accordance with embodiments. Up until this point, the die-to-die routings 140 have been described and illustrated with regard to metal routing layers and spacing/areas. Furthermore, the die-to-die routings 140 have been illustrated as straight or having right angle corners. It is to be appreciated that this is exemplary, and that the die-to-die routings 140 can assume a variety of contours within a metal rouging layer 132, including curved, etc. Additionally, the die-to-die routing 140 can also be formed in pairs, or multiples, with similar longitudinal distances. Such configurations are shown in FIGS. 5A, with right angle turns, and FIG. 5B with straight connections. While embodiments are not strictly so limited, the die-to-die routing 140 pairs may also be within the areas added by spacings S1, S2, and may optionally be mirror images across diagonal die corners. Additionally, die-to-die routings 140 may be within the same metal routing layers rather than multiple metal routing layers.

Figure 6:
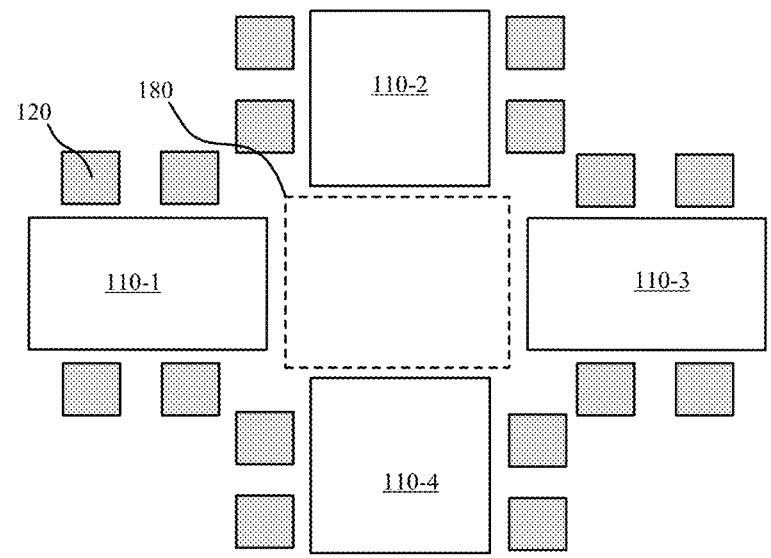
FIG. 6 is a schematic top-down view illustration of an MCM including a cross-bar die between a plurality of dies in accordance with an embodiment.
Figure 7:
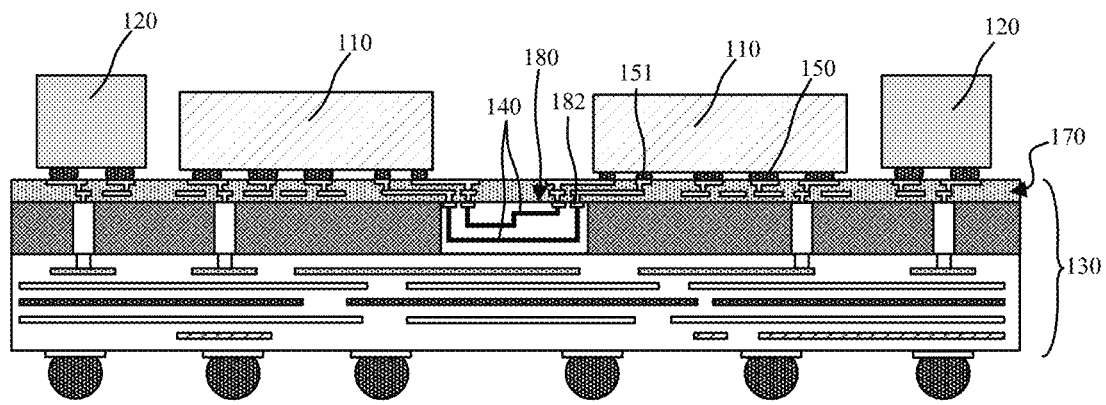
FIG. 7 is a schematic cross-sectional side view illustration of an MCM including an embedded cross-bar die with various die-to-die routings in accordance with an embodiment.
Figure 8:
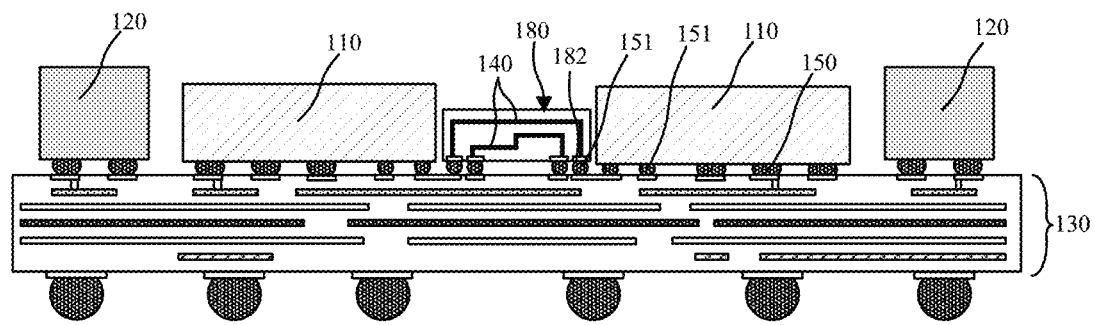
FIG. 8 is a schematic cross-sectional side view illustration of an MCM including a surface mounted cross-bar die with various die-to-die routings in accordance with an embodiment.

Up until this point routing substrates 130 including metal routing layers 132 have been described as forming the die-to-die routing 140. In other embodiments the die-to-die routings 140 can be included in a discrete cross-bar die 180, which may be an active die with active devices or a passive structure. In an embodiment, the cross-bar die 180 is an active die with logic and appropriate switches and repeaters. Alternatively, a passive cross-bar die 180 may be provided using multiple passivation layers. FIG. 6 is a schematic top-down view illustration of an MCM including a cross-bar die 180 between a plurality of dies in accordance with an embodiment. For example, the cross-bar die 180 may be embedded face-up within the routing substrate 130 as shown in FIG. 7, or face-down, similarly as the I/O dies 160 previously described. As shown, RDL 170 may be formed directly on pads 182 of the cross-bar die 180. Alternatively, the cross-bar die 180 can be surface mounted onto the routing substrate 130 with micro-bumps 151 similar to the dies 110 as shown in FIG. 8.

Placing the components 120 (e.g. DRAM dies) directly across the spaced apart dies 110 (e.g. SOC dies) as shown in FIG. 6, the data, command/address and clock signal trace lengths form the DRAM dies to the SOC dies can be kept to the shortest possible by routing them in a more or less straight-line fashion in the upper metal layer 132U, intermediate metal layer 132I, and lower metal layer 132 of the routing substrate 130. By limiting any given signal routing between the DRAM die and the SOC die to only one of the routing substrate 130 metal routing layers 132, impedance discontinuity can be minimized and maximum signal integrity can be achieved. This facilitates the data transfer between the DRAM die and the SOC die at the fastest possible data rate.

In utilizing the various aspects of the embodiments, it would become apparent to one skilled in the art that combinations or variations of the above embodiments are possible for forming an MCM with multiple dies and die-to-die routings. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A multi-chip module comprising:
a routing substrate including an upper metal routing layer, an intermediate metal routing layer, and a lower metal routing layer;
a first die mounted on the routing substrate;
a second die mounted on the routing substrate diagonally adjacent to the first die;
a third die mounted on the routing substrate laterally opposite to the first die, wherein a first die edge of the first die faces a third die edge of the third die;
a first die-to-die routing in the routing substrate connecting the first die to the second die, wherein the first die-to die routing spans a first longitudinal distance in one or more metal routing layers of the routing substrate; and
a second die-to-die routing connecting the first die to the third die, wherein the second die-to-die routing spans a second longitudinal distance in a single metal routing layer of the routing substrate that is greater than the first longitudinal distance.

2. The multi-chip module of claim 1, wherein the second die includes a second die edge orthogonal to the first die edge and the third die edge.

3. The multi-chip module of claim 2, wherein:
the first die edge is separate from the third die edge by a distance that is greater than a width of the second die edge.

4. The multi-chip module of claim 3, wherein the second longitudinal distance is greater than a width of the second die edge.

5. The multi-chip module of claim 3, wherein the first die edge is spaced apart from a second parallel edge of the second die by a first spacing.

6. The multi-chip module of claim 5, wherein the second die edge is spaced apart from a first parallel edge of the first die by a second spacing.

7. The multi-chip module of claim 6, wherein the first die-to-die routing is substantially located in an area defined by the first spacing and the second spacing.

8. The multi-chip module of claim 7, wherein the second die-to-die routing is substantially located in an area between the first die edge and the third die edge.

9. The multi-chip module of claim 8, wherein the first longitudinal distance of the first die-to-die routing spans within the upper metal routing layer and the intermediate metal routing layer.

10. The multi-chip module of claim 9, wherein the second longitudinal distance of the second die-to-die routing spans within the upper metal routing layer or the intermediate metal routing layer.

11. The multi-chip module of claim 10, further comprising a third die-to-die routing in the routing substrate connecting the first die to the second die, wherein the third die-to die routing spans a third longitudinal distance within the lower metal routing layer.

12. The multi-chip module of claim 1, wherein the routing substrate comprises:

a molding compound layer over the upper metal routing layer; and
one or more first input/output (I/O) dies, one or more second I/O dies, and one or more third I/O dies embedded in the molding compound layer;
wherein the first die is mounted over the one or more first I/O dies, the second die is mounted over the one or more second I/O dies, and the third die is mounted over the one or more third I/O dies.

13. The multi-chip module of claim 12, wherein the one or more first I/O dies includes a first I/O die that is wider than the first die edge.

14. A multi-chip module comprising:
a routing substrate including a plurality of metal routing layers;
a first die mounted on the routing substrate;
a second die mounted on the routing substrate diagonally adjacent to the first die; and
a third die mounted on the routing substrate laterally opposite to the first die;
wherein:
a first die edge of the first die faces a third die edge of the third die, and a second die edge of the second die is orthogonal to the first die edge and the third die edge;
the first die edge is separate from the third die edge by a distance that is greater than a width of the second die edge;
the first die edge is spaced apart from a second parallel edge of the second die by a first spacing; and
the second die edge is spaced apart from a first parallel edge of the first die by a second spacing;
a first die-to-die routing in the substrate connecting the first die to the second die, wherein the first die-to die routing spans a first longitudinal distance; and
a second die-to-die routing connecting the first die to the third die, wherein the second die-to-die routing spans a second longitudinal distance that is greater than the first longitudinal distance.

15. The multi-chip module of claim 14, wherein the first die-to-die routing is substantially located an area defined by the first spacing and the second spacing.

16. The multi-chip module of claim 15, wherein the second die-to-die routing is substantially located in an area between the first die edge and the third die edge.

17. The multi-chip module of claim 16, wherein:
the first longitudinal distance is in at least two metal routing layers of the plurality of metal routing layers; and
the second longitudinal distance is in a single metal routing layer of the plurality of metal routing layers.

18. The multi-chip module of claim 17, wherein at least one of the at least two metal routing layers is in the single metal routing layer.

19. The multi-chip module of claim 14, wherein the routing substrate comprises:
a molding compound layer over the plurality of metal routing layers; and
one or more first input/output (I/O) dies, one or more second I/O dies, and one or more third I/O dies embedded in the molding compound layer;
wherein the first die is mounted over the one or more first I/O dies, the second die is mounted over the one or more second I/O dies, and the third die is mounted over the one or more third I/O dies.

20. The multi-chip module of claim 19, wherein the one or more first I/O dies includes a first I/O die that is wider than the first die edge.

21. A multi-chip module comprising:
- a routing substrate including a plurality of metal routing layers;
- a first die mounted on the routing substrate;
- a second die mounted on the routing substrate diagonally adjacent to the first die; and
- a third die mounted on the routing substrate laterally opposite to the first die;

wherein:
- a first die edge of the first die faces a third die edge of the third die, and a second die edge of the second die is orthogonal to the first die edge and the third die edge;
- the first die edge is separate from the third die edge by a distance that is greater than a width of the second die edge;
- the first die edge is spaced apart from a second parallel edge of the second die by a first spacing; and
- the second die edge is spaced apart from a first parallel edge of the first die by a second spacing;
- a first die-to-die routing connecting the first die to the second die, wherein the first die-to-die routing is substantially located within a first metal routing layer of the plurality of metal routing layers; and
- a second die-to-die routing connecting the first die to the third die, wherein the second die-to-die routing is substantially located within a second metal routing layer of the plurality of metal routing layers, which is the same or different from the first metal routing layer.

22. The multi-chip module of claim 21, wherein the first metal routing layer and the second metal routing layer are the same metal routing layer of the plurality of metal routing layers.

23. The multi-chip module of claim 21, wherein the first metal routing layer and the second metal routing layer are a lower metal routing layer of the plurality of metal routing layers.

24. The multi-chip module of claim 21, wherein the first metal routing layer and the second metal routing layer are different metal routing layers of the plurality of metal routing layers.

* * * * *